(12) United States Patent
Enomoto et al.

(10) Patent No.: US 9,371,231 B2
(45) Date of Patent: Jun. 21, 2016

(54) APATITE CRYSTAL

(71) Applicant: Koito Manufacturing Co., Ltd., Minato-ku (JP)

(72) Inventors: Kiminori Enomoto, Shizuoka (JP); Hisayoshi Daicho, Shizuoka (JP); Yu Shinomiya, Shizuoka (JP)

(73) Assignee: KOITO MANUFACTURING CO., LTD., Minato-Ku, Tokyo (JP)

(*) Notice: Subject to any disclaimer, the term of this patent is extended or adjusted under 35 U.S.C. 154(b) by 0 days.

(21) Appl. No.: 14/497,553

(22) Filed: Sep. 26, 2014

(65) Prior Publication Data

US 2015/0017442 A1 Jan. 15, 2015

Related U.S. Application Data

(63) Continuation of application No. PCT/JP2013/001928, filed on Mar. 21, 2013.

(30) Foreign Application Priority Data

Apr. 9, 2012 (JP) ................. 2012-088133

(51) Int. Cl.
*C01B 25/455* (2006.01)
*C01B 25/32* (2006.01)
*C30B 29/14* (2006.01)
*C30B 29/60* (2006.01)
*C30B 7/10* (2006.01)
*C30B 9/12* (2006.01)
*C30B 15/00* (2006.01)

(52) U.S. Cl.
CPC ............. *C01B 25/455* (2013.01); *C01B 25/32* (2013.01); *C01B 25/321* (2013.01); *C30B 7/10* (2013.01); *C30B 9/12* (2013.01); *C30B 15/00* (2013.01); *C30B 29/14* (2013.01); *C30B 29/607* (2013.01); *Y10T 428/2975* (2015.01)

(58) Field of Classification Search
CPC .... C01B 25/455; C01B 25/32; C01B 25/321; C10B 29/607; C10B 29/14; C30B 29/14; C30B 29/607; C30B 7/10; C30B 9/12; C30B 15/00; Y10T 428/2975
USPC ................................. 428/398, 402
See application file for complete search history.

(56) References Cited

U.S. PATENT DOCUMENTS 8,815,328 B2 * 8/2014 Riman et al. ................. 427/2.27
2005/0223944 A1 10/2005 Kazin et al.

FOREIGN PATENT DOCUMENTS

| CN | 87102573 A | 11/1987 |
|---|---|---|
| CN | 1078452 A | 11/1993 |
| CN | 1425472 A | 6/2003 |
| CN | 101172592 A | 5/2008 |
| CN | 101428779 A | 5/2009 |
| CN | 101786615 A | 7/2010 |
| JP | 2011-011971 A | 1/2011 |
| JP | 2011011971 * | 1/2011 |
| WO | 2007003969 A2 | 1/2007 |

OTHER PUBLICATIONS

Ma, Ming-Guo et al., "Solvothermal preparation of hydroxyapatite microtubes in water . . . ", Material Letters, 2008, vol. 62, pp. 1642-1645.*

Hui, Junfeng et al., "Monodisperse F-substitured hydoxyapateite single-crystal nanotubes with aphiphilic surface properties", Inorganic Chemistry, 2009, vol. 48, No. 13, pp. 5614-5616.*

Teshima, et al., "Direct growth of highly crystalline, idiomorphic fluorapatite crystals on a polymer substrate," Crystal Growth & Design Communication, 2009, pp. 3832-3834, vol. 9, American Chemical Society.

Hui, et al., "Monodisperse f-substituted hydroxyapatite single-crystal nanotubes with amphiphilic surface properties," Inorganic Chemistry Communication, 2009, pp. 5614-5616, vol. 48, American Chemical Society.

Ma, et al., "Solvothermal preparation of hydroxyapatite microtubes in water/N,N-dimethylformamide mixed solvents," Materials Letters, 2008, pp. 1642-1645, vol. 62, Elsevier B.V.

Zhou, et al., "Single-crystal microtubes of a novel apatite-type compound, (Na2.5Bi2.5)(PO4)3(F,OH), with well-faceted hexagonal cross sections," CrystEngComm, 2009, vol. 11, pp. 1863-1867, The Royal Society of Chemistry.

International Preliminary Report on Patentability and the Written Opinion of the International Searching Authority (Forms PCT/IB373 and PCT/ISA/237) issued on Oct. 14, 2014, by the International Bureau of WIPO, in corresponding International Application No. PCT/JP2013/001928. (9 pages).

International Search Report (Form PCT/ISA/210) issued on May 7, 2013, by the Japanese Patent Office in corresponding International Application No. PCT/JP2013/001928. (4 pages).

Extended Search Report issued by the European Patent Office in corresponding European Patent Application No. 13775876.9 on Oct. 20, 2015 (5 pages).

(Continued)

*Primary Examiner* — Leszek Kiliman

(74) *Attorney, Agent, or Firm* — Buchanan Ingersoll & Rooney PC

(57) ABSTRACT

An apatite crystal is a single crystal expressed by a general formula $(M^2)_5(PO_4)_3X$. In this formula, $M^2$ indicates at least one type of element selected from the group consisting of bivalent alkaline-earth metals and Eu, and X indicates at least one type of element or molecule selected from the group consisting of halogen elements and OH. And the single crystal is of a tubular shape. The outer shape of the apatite may be a hexagonal prism. The shape of an opening of a hole formed in the upper surface or lower surface of the hexagonal prism may be a hexagon.

15 Claims, 1 Drawing Sheet

(56) References Cited

OTHER PUBLICATIONS

Korean Office Action (Notification of Reasons for Refusal) issued by the Korean Patent Office in corresponding Korean Patent Application No. 10-2014-7030708 on Feb. 26, 2016 (7 pages including partial English translation).

Chinese Office Action (The First Office Action) issued by the Chinese Patent Office in corresponding Chinese Patent Application No. 201380017666.1 on Mar. 29, 2016 (17 pages, including an English Translation).

Deli Jiang, "Study on the Preparation of Phosphonio-nanocomposites and the Catalytic Performance Thereof," Doctoral Dissertation of Jiangsu University, Jun. 2011, (8 pages, including partial English Translation).

* cited by examiner

APATITE CRYSTAL

CROSS-REFERENCE TO RELATED APPLICATIONS

This application is based upon and claims the benefit of priority from the prior Japanese Patent Application No. 2012-088133, filed on Apr. 9, 2012 and International Patent Application No. PCT/JP2013/001928, filed on Mar. 21, 2013, the entire content of each of which is incorporated herein by reference.

BACKGROUND OF THE INVENTION

1. Field of the Invention

The present invention relates to crystalline apatite, which is applicable to or usable in a wide range of fields, as a functional material.

2. Description of the Related Art

In recent years, apatite-based materials used as phosphors and biofunctional materials are being actively developed. Solid apatite single crystals, which are hexagonal prisms in shape, are known as such apatite-based crystals (see Non-patent Document 1, for instance).

RELATED ART DOCUMENTS

[Non-patent Document 1] Katsuya Teshima et al., "Direct growth of highly crystalline, idiomorphic fluorapatite crystals on a polymer substrate", Crystal Growth & Design, 2009, Vol. 9, No. 9, pp. 3832-3834.

The apatite-based materials are applicable to various uses and there is still room for improvement in the shape and components suitable for their uses.

SUMMARY OF THE INVENTION

The present invention has been made in view of the foregoing circumstances, and a purpose thereof is to provide a new type of apatite crystal.

In order to resolve the above-described problems, an apatite crystal according to one embodiment of the present invention is a single crystal expressed by a general formula $(M^2)_5(PO_4)_3X$ where $M^2$ indicates at least one type of element selected from the group consisting of bivalent alkaline-earth metals and Eu, and X indicates at least one type of element or molecule selected from the group consisting of halogen elements and OH, and the single crystal is of a tubular shape.

Optional combinations of the aforementioned constituting elements, and implementations of the invention in the form of methods, apparatuses, systems, and so forth may also be effective as additional modes of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which.

DETAILED DESCRIPTION OF THE INVENTION

Figure 1:
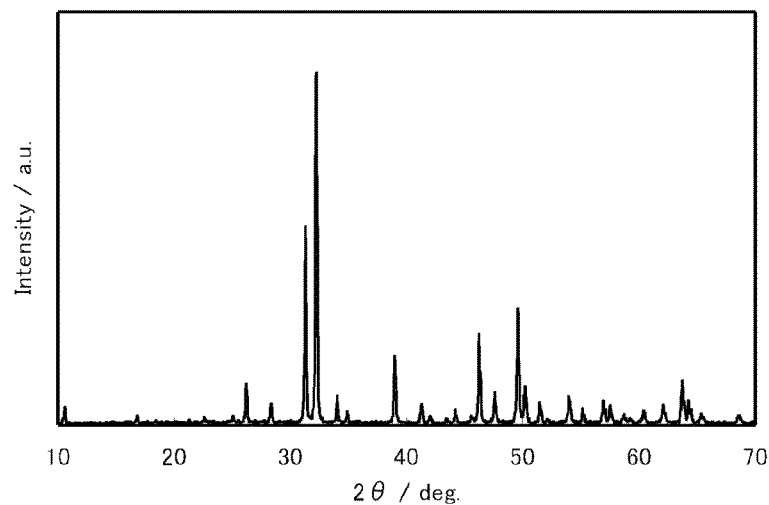
FIG. 1 shows an example of X-ray diffraction patterns for crystals produced by using the methods in the exemplary embodiments.

An apatite crystal according to one embodiment of the present invention is a single crystal expressed by a general formula $(M^2)_5(PO_4)_3X$ where $M^2$ indicates at least one type of element selected from the group consisting of bivalent alkaline-earth metals and Eu, and X indicates at least one type of element or molecule selected from the group consisting of halogen elements and OH, and the single crystal is of a tubular shape.

By employing this embodiment, another material can be held or contained inside the apatite, so that the apatite is applicable to a new usage or can be used for a new application.

The outer shape of the apatite may be a hexagonal prism, and the shape of an opening of a hole formed in an upper surface or lower surface of the hexagonal prism may be a hexagon. Thereby, an apatite crystal where the thickness of apatite tube is uniform is obtained.

The inside diameter of the hole may be in a range of 10 nm to 60 μm.

The diameter of the apatite may be in a range of 20 nm to 100 μm.

The length of the apatite in a longitudinal direction thereof may be in a range of 50 nm to 4 mm.

The transmittance of the apatite relative to the visible light may be greater than or equal to 65%.

Hereinafter, a detailed description is given of embodiments of the present invention.

An apatite crystal according to the present embodiment is a single crystal whose form is tubular. This apatite crystal is expressed by a general formula $(M^2)_5(PO_4)_3X$. In this general formula, $M^2$ indicates at least one type of element selected from the group consisting of bivalent alkaline-earth metals and Eu, and X indicates at least one type of element or molecule selected from the group consisting of halogen elements and OH. The alkaline-earth metals as used herein may be Ca, Sr, Ba, Ra, Mg, Be and the like, for instance. The halogen elements as used herein may be F, Cl, Br, I and the like, for instance.

A description will be given hereinbelow of a method for producing a tubular single crystal of apatite with reference to each exemplary embodiment. A description is hereunder given of a present embodiment in further detail using the exemplary embodiment. First to seventh exemplary embodiments each shows a method for compounding chlorapatite single crystals. Eight to tenth exemplary embodiments each show a method for compounding hydroxyapatite single crystals. The compounding or synthesizing method may be a flux method, a coprecipitation method and a sol-gel method, for instance.

Chlorapatite Single Crystals (First Exemplary Embodiment: Flux Method Used)

First, $CaHPO_4$, $CaCO_3$ and $CaCl_2$ are weighed in such that the mole ratio of Ca:P:Cl in these materials is 5:3:1, and are uniformly mixed together. Then, NaCl is added such that the concentration of chlorapatite is 0.15 mol %. And the temperature of this mixture is raised to a temperature range of 800 to 1,100° C. at a temperature raising rate of 100 to 500° C./h in a platinum crucible, and the mixed materials are synthesized for 48 hours at a synthesis temperature of 800 to 1,100° C. After this, the temperature of the mixture is lowered to 500° C. from the temperature range of 800 to 1,100° C. at a temperature dropping rate of 5 to 300° C./h before the mixed materials are naturally cooled to room temperature. After the mixture has been calcinated, the fired product is thoroughly cleansed with warm pure water (the water temperature is about 80° C.) so as to extract a chlorapatite single crystal.

(Second Exemplary Embodiment: Flux Method Used)

First, $CaHPO_4$, $CaCO_3$ and $CaCl_2$ are weighed in such that the mole ratio of Ca:P:Cl in these materials is 5:3:1, and are uniformly mixed together. Then, a large quantity of $CaCl_2$ is added. And the temperature of this mixture is raised to a temperature range of 800 to 1,100° C. at a temperature raising rate of 100 to 500° C./h in the platinum crucible, and the mixed materials are synthesized for 48 hours at a synthesis temperature range of 800 to 1,100° C. After this, the temperature of the mixture is lowered to 500° C. from the temperature range of 800 to 1,100° C. at a temperature dropping rate of 5 to 300° C./h before the mixed materials are naturally cooled to room temperature. After the mixture has been calcinated, the fired product is thoroughly cleansed with warm pure water (the water temperature is about 80° C.) so as to extract a chlorapatite single crystal.

(Third Exemplary Embodiment: Flux Method Used)

First, $CaHPO_4$, $CaCO_3$, $SrCO_3$, $CaCl_2$ and $SrCl_2$ are weighed in such that the mole ratio of Ca+Sr:P:Cl in these materials is 5:3:1, and are uniformly mixed together. Then, $SrCl_2$ is added such that the concentration of chlorapatite is 0.15 mol %. And the temperature of this mixture is raised to a temperature range of 800 to 1,100° C. at a temperature raising rate of 100 to 500° C./h in the platinum crucible, and the mixed materials are synthesized for 48 hours at a synthesis temperature range of 800 to 1,100° C. After this, the temperature of the mixture is lowered to 500° C. from the temperature range of 800 to 1,100° C. at a temperature dropping rate of 5 to 300° C./h before the mixed materials are naturally cooled to room temperature. After the mixture has been calcinated, the fired product is thoroughly cleansed with warm pure water (the water temperature is about 80° C.) so as to extract a chlorapatite single crystal.

(Fourth Exemplary Embodiment: Flux Method Used)

First, $CaHPO_4$, $CaCO_3$, $MgCO_3$, $CaCl_2$ and $MgCl_2$ are weighed in such that the mole ratio of Ca+Mg:P:Cl in these materials is 5:3:1, and are uniformly mixed together. Then, $MgCl_2$ is added such that the concentration of chlorapatite is 0.15 mol %. And the temperature of this mixture is raised to a temperature range of 800 to 1,100° C. at a temperature raising rate of 100 to 500° C./h in the platinum crucible, and the mixed materials are synthesized for 48 hours at a synthesis temperature range of 800 to 1,100° C. After this, the temperature of the mixture is lowered to 500° C. from the temperature range of 800 to 1,100° C. at a temperature dropping rate of 5 to 300° C./h before the mixed materials are naturally cooled to room temperature. After the mixture has been calcinated, the fired product is thoroughly cleansed with warm pure water (the water temperature is about 80° C.) so as to extract a chlorapatite single crystal.

(Fifth Exemplary Embodiment: Coprecipitation Method Used)

First, calcium nitrate and calcium chloride are dissolved in pure water, and phosphoric acid is dripped into its solution. And the potential hydrogen (pH) of the solution is adjusted to 5 to 9. Thereby, a precipitation (seed crystal) is formed. The seed crystal adjusted by using the coprecipipation method is now crystal-grown using a Czochralski method. In a $CaCl_2$—$Ca_2ClPO_4$ binary system phase diagram, one whose $Ca_2ClPO_4$ concentration is 15 mol %, is heated to 1,200° C., and the seed crystal is soaked in a high-temperature solution. While the crystal is slowly cooled to 1,050° C. from 1,200° C., the crystal is pulled up so as to obtain a chlorapatite single crystal.

(Sixth Exemplary Embodiment: Sol-Gel Method Used)

First, calcium nitrate is dissolved in the distilled water, and phosphoric acid ethoxide is further added (the total molar concentration of calcium and phosphorus: 0.05 moles/liter (mol/L)) and stirred. After this, concentrated hydrochloric acid, where chlorine is "1" relative to 1 mole of calcium, is added. This solution is dried out at 60° C. for two hours so as to remove the distilled water. This obtains a seed crystal. The seed crystal adjusted by using the sol-gel method is now crystal-grown using the Czochralski method. In a $CaCl_2$—$Ca_2ClPO_4$ binary system phase diagram, one whose $Ca_2ClPO_4$ concentration is 15 mol %, is heated to 1,200° C., and the seed crystal is soaked in a high-temperature solution. While the crystal is slowly cooled to 1,050° C. from 1,200° C., the crystal is pulled up so as to obtain a chlorapatite single crystal.

(Seventh Exemplary Embodiment: Sol-Gel Method Used)

First, calcium nitrate is dissolved in the distilled water, and phosphoric acid is further added (the total molar concentration of calcium and phosphorus: 0.05 mol/L) and stirred before concentrated hydrochloric acid is added. This solution is dried out at 60° C. for two hours so as to remove the distilled water. This obtains a seed crystal. The seed crystal adjusted by using the sol-gel method is now crystal-grown using the Czochralski method. In a $CaCl_2$—$Ca_2ClPO_4$ binary system phase diagram, one whose $Ca_2ClPO_4$ concentration is 15 mol %, is heated to 1,200° C., and the seed crystal is soaked in a high-temperature solution. While the crystal is slowly cooled to 1,050° C. from 1,200° C., the crystal is pulled up so as to obtain a chlorapatite single crystal.

Hydroxyapatite Single Crystals (Eighth Exemplary Embodiment: Coprecipitation Method Used)

First, phosphoric acid aqueous solution whose molar concentration of phosphoric acid is 0.5 mol/L is dripped into a suspension liquid of calcium hydroxide the molar concentration of which is 0.3 mol/L, and the pH of the solution is adjusted to 5 to 9 while care is being exercised so that a single crystal can be grown. Thereby, a precipitation (seed crystal) is formed. The seed crystal adjusted by using the coprecipipation method is now crystal-grown using the Czochralski method. Calcium hydroxide is heated to 1,650° C., and the seed crystal is soaked in a high-temperature solution. While the crystal is slowly cooled to 1,000° C. from 1,650° C., the crystal is pulled up so as to obtain a needle-shaped hydroxyapatite single crystal.

(Ninth Exemplary Embodiment: Hydrothermal Method Used)

First, 63.37 grams of lactic acid is dissolved in 1 liter of water, then 22.11 grams of calcium hydroxide is added and, furthermore, 6.92 grams of phosphoric acid is dissolved and mixed together. The thus prepared slurry is filled into an autoclave and is hydrothermally processed at 165° C. for 5 hours. Then, the thus processed slurry is filtered and dried out so as to obtain a hydroxyapatite single crystal.

(Tenth Exemplary Embodiment: Sol-Gel Method Used)

$1.0 \times 10^{-2}$ moles of calcium diethoxide is dissolved in 6.5 ml of ethylene glycol. Then, $6.0 \times 10^{-3}$ moles of triethyl phosphite is taken such that the composition ratio of hydroxyapatite is Ca/P=5/3, and is dissolved in a predetermined amount of ethanol. Then, a mixed solution of the ethylene glycol solution with calcium diethoxide and the triethyl phosphite solution is stirred for two hours, thereby causing a precipitation. The precipitation is heated at 200° C. for two hours so as to obtain a seed crystal. The seed crystal adjusted by using the sol-gel method is now crystal-grown using the Czochralski method. Calcium hydroxide is heated to 1,650° C., and the seed crystal is soaked in a high-temperature solution. While the crystal is slowly cooled to 1,000° C. from 1,650° C., the crystal is pulled up so as to obtain a needle-shaped hydroxyapatite single crystal.

Conversion from Chlorapatite to Hydroxyapatite (Eleventh Exemplary Embodiment)

A chlorapatite single crystal (20 mg) together with an aqueous solution (40 μl) of potassium hydroxide (KOH) whose molar concentration is 6.25 (mol/L) are put into a platinum capsule (the diameter: 2.6 mmφ, the length: 3.3 mm) and is heat-sealed. Then a hydrothermal treatment is carried out using a test-tube-type autoclave. In this hydrothermal treatment, water is used as a pressure medium and the treatment is done under a condition of 100 MPa. The temperature raising rate is 20° C. per minute, and the treatment time is fixed at 48 hours. Thereby, a hydroxyapatite single crystal is obtained.

(Twelfth Exemplary Embodiment)

A chlorapatite single crystal (20 mg) is heated to a temperature of 1,300° C. and is reacted with steam by supplying the steam within a kiln or furnace over two weeks. This concerts the chlorapatite single crystal into a hydroxyapatite single crystal.

[Composition]

Next, we have examined about the composition of the chlorapatite crystal produced using the methods in each of the exemplary embodiments. FIG. 1 shows an example of X-ray diffraction patterns for crystals produced by using the methods in the exemplary embodiments. As is evident from FIG. 1, it had been found that the crystal is composed of a single layer of chlorapatite crystal $Ca_5(PO_4)_3Cl$.

[Constituents]

Next, an elemental analysis of a single crystal of chlorapatite tube has been done. The elemental analysis thereof had revealed that this crystal is constituted such that Ca=39.10 mass %, P=18.00 mass %, and Cl=5.30 mass %.

[Shapes]

Figure 2:
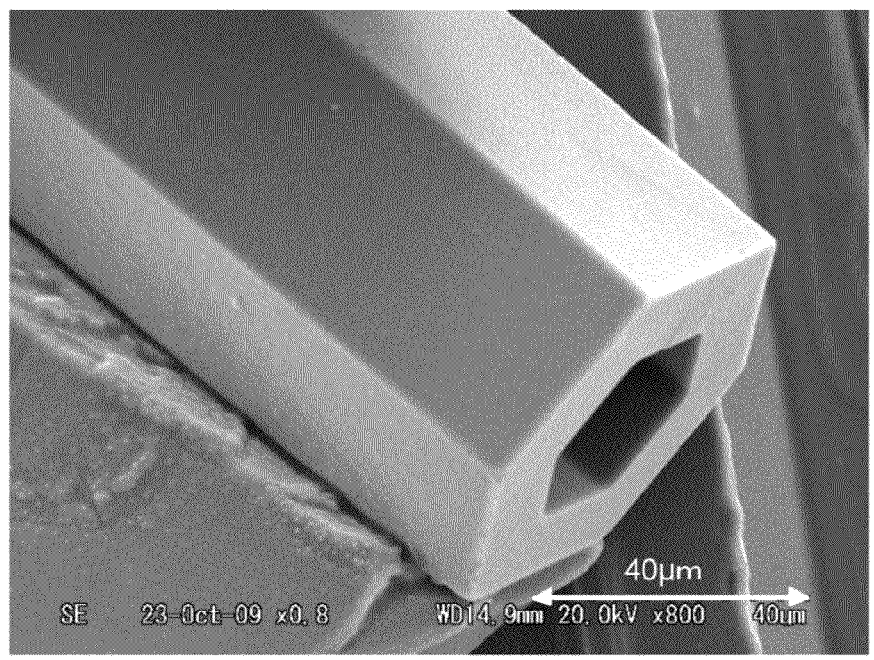
FIG. 2 is a photograph showing an example of a single crystal of chlorapatite tube observed by a scanning electron microscopy (SEM).

Next, the shape of a single crystal of chlorapatite tube has been observed using a scanning electron microscopy (SEM). FIG. 2 is a photograph showing an example of a single crystal of chlorapatite tube observed by SEM. As shown in FIG. 2, an apatite single crystal according to the present embodiment is of a tubular shape, and the outer shape of the apatite single crystal is a hexagonal prism (hexagonal column or hexagonal cylinder). Also, the shape of an opening of a hole formed in an upper surface or lower surface of the hexagonal prism is a hexagon. Thus, the thickness of an outside wall of this tube is practically uniform.

The observation using the SEM has revealed that various sizes and forms are available for such tubular single crystals. For example, the inside diameter of the hole of a tubular single crystal may be in a range of about 10 nm to about 60 μm. Also, the diameter of a tubular single crystal may be in a range of about 20 nm to about 100 μm. Also, the length of a tubular single crystal in a longitudinal direction thereof may be in a range of about 50 nm to about 4 mm. Also, the transmittance of a tubular single crystal relative to the visible light may be greater than or equal to 65%.

[Intended Use]

A description is now given of the usages of a tubular single crystal of apatite.

(Utilization of Internal Space)

Since the tubular single crystal of apatite can hold or contain other different material(s) inside the apatite, this apatite is applicable to the following new usages (1) to (5), for instance.

(1) Filling an internal space of the tubular single crystal of apatite with a Mg—Ni alloy allows this apatite to be used for a fuel cell as a hydrogen storage material.

(2) Trapping a gas molecule adsorbing material inside the tubular single crystal of apatite allowing this apatite to be used as a nanopore material.

(3) Filling an internal space of the apatite single crystal with amino acid allowing this apatite to be used as a bio-column that separates and refines DNA from a cell.

(4) Filling an internal space of the apatite single crystal with a catalyst and/or an enzyme allowing this apatite to be used as a reaction site for a decomposition column of gas or solvent, or a bioreactor.

(5) The tubular single crystal of apatite can be used as a column where a carbon nanotube or organic material is inserted inside the apatite single crystal and then these insertions are put and aligned in a certain order.

[Functions by Shapes]

Depending on the shape and/or the size, the tubular single crystal of apatite is applicable to the following usages (6) to (10), for instance.

(6) Filling an internal space of the tubular single crystal of apatite with a medicine allows this apatite to be used as a drug delivery system.

(7) Since the tubular single crystal of apatite has a high aspect ratio, this apatite can be used as a reinforcing material (stiffener) in combined materials.

(8) The tubular single crystal of apatite can be used as an atmosphere culturing site where the shape of this apatite is utilized.

(9) This apatite can be used as a terahertz light-emitting device.

(10) This apatite is applicable to the usage where the expansion and contraction in volume inside this tube are utilized.

(Functions by Materials)

The apatite according to the present embodiment can be used for a phosphor, an electron emission material, a photocatalyst apatite, a stiffener for bones, and the like. Also, the apatite according to the present embodiment can be used for application where the optical property of being transparent is utilized.

The present invention has been described based upon the illustrative embodiment and exemplary embodiments. The embodiment and each exemplary embodiment are intended to be illustrative only and it will be obvious to those skilled in the art that various modifications to constituting elements and processes could be developed and that such modifications are also within the scope of the present invention.

The apatite single crystals according to the exemplary embodiments of the present invention are usable as various types of functional materials including the phosphors.

What is claimed is:

1. An apatite crystal, wherein the apatite crystal is a single crystal expressed by a general formula $(M^2)_5(PO_4)_3X$ where $M^2$ indicates at least one type of element selected from the group consisting of bivalent alkaline-earth metals and Eu, and X indicates at least one type of element or molecule selected from the group consisting of halogen elements, and wherein the single crystal is of a tubular shape.

2. An apatite crystal according to claim 1, where an outer shape of the apatite crystal is a hexagonal prism, and a shape of an opening of a hole formed in an upper surface or lower surface of the hexagonal prism is a hexagon.

3. An apatite crystal according to claim 2, wherein an inside diameter of the hole is in a range of 10 nm to 60 μm.

4. An apatite crystal according to claim 1, wherein a diameter of the apatite crystal is in a range of 20 nm to 100 μm.

5. An apatite crystal according to claim 1, wherein a length of the apatite crystal in a longitudinal direction thereof is in a range of 50 nm to 4 mm.

6. An apatite crystal according to claim 1, wherein a transmittance of the apatite crystal relative to a visible light is greater than or equal to 65%.

7. An apatite crystal according to claim 2, wherein a diameter of the apatite crystal is in a range of 20 nm to 100 µm.

8. An apatite crystal according to claim 3, wherein a diameter of the apatite crystal is in a range of 20 nm to 100 µm.

9. An apatite crystal according to claim 2, wherein a length of the apatite crystal in a longitudinal direction thereof is in a range of 50 nm to 4 mm.

10. An apatite crystal according to claim 3, wherein a length of the apatite crystal in a longitudinal direction thereof is in a range of 50 nm to 4 mm.

11. An apatite crystal according to claim 4, wherein a length of the apatite crystal in a longitudinal direction thereof is in a range of 50 nm to 4 mm.

12. An apatite crystal according to claim 2, wherein a transmittance of the apatite crystal relative to a visible light is greater than or equal to 65%.

13. An apatite crystal according to claim 3, wherein a transmittance of the apatite crystal relative to a visible light is greater than or equal to 65%.

14. An apatite crystal according to claim 4, wherein a transmittance of the apatite crystal relative to a visible light is greater than or equal to 65%.

15. An apatite crystal according to claim 5, wherein a transmittance of the apatite crystal relative to a visible light is greater than or equal to 65%.

\* \* \* \* \*